(12) United States Patent
Thio (10) Patent No.: US 6,441,298 B1
(45) Date of Patent: Aug. 27, 2002

(54) SURFACE-PLASMON ENHANCED PHOTOVOLTAIC DEVICE

(75) Inventor: Tineke Thio, Princeton, NJ (US)

(73) Assignee: NEC Research Institute, Inc, Princeton, NJ (US)

(*) Notice: Subject to any disclaimer, the term of this patent is extended or adjusted under 35 U.S.C. 154(b) by 0 days.

(21) Appl. No.: 09/638,686

(22) Filed: Aug. 15, 2000

(51) Int. Cl.[7] .................... H01L 31/0352; H01L 31/052
(52) U.S. Cl. .................. 136/250; 136/259; 136/246; 257/434; 257/432; 257/461; 438/63; 438/65; 438/69
(58) Field of Search ................ 136/250, 259, 136/246; 257/434, 432, 461; 438/63, 65, 69

(56) References Cited

U.S. PATENT DOCUMENTS

| | | | |
|---|---|---|---|
| 3,866,037 A | | 2/1975 | Simpson |
| 4,360,273 A | | 11/1982 | Thaxter |
| 4,405,238 A | | 9/1983 | Grobman et al. |
| 4,407,320 A | * | 10/1983 | Levine ............... 136/250 |
| 4,411,013 A | | 10/1983 | Takasu et al. |
| 4,482,778 A | * | 11/1984 | Anderson ............ 136/246 |
| 4,554,727 A | * | 11/1985 | Deckman et al. ....... 438/71 |
| 4,556,790 A | | 12/1985 | Glass et al. |
| 4,582,588 A | * | 4/1986 | Jensen et al. .......... 136/250 |
| 4,614,835 A | | 9/1986 | Carson et al. |
| 4,659,429 A | | 4/1987 | Isaacson et al. |
| 4,662,747 A | | 5/1987 | Isaacson et al. |
| 4,663,828 A | | 5/1987 | Hanak |
| 4,663,829 A | | 5/1987 | Hartman et al. |
| 4,815,854 A | | 3/1989 | Tanaka et al. |
| 4,891,830 A | | 1/1990 | Iwahashi |
| 5,028,546 A | * | 7/1991 | Hotchkiss ............. 136/250 |

(List continued on next page.)

FOREIGN PATENT DOCUMENTS

JP   05-240787 A   *   9/1993

OTHER PUBLICATIONS

Beth, H.A., "Theory of Diffraction by Small Holes", vol. 66, No. 7 and 8, pp. 163–182, Oct. 1994.
Caldwell, M.E., et al., "Surface–plasmon spatial light modulators based on liquid crystal", Applied Optics, vol. 31, No. 20, pp. 3380–3891, Jul. 1992.
Chown, M., "Tight fit", New Scientist, No. 2121, Feb. 1998.
Cowan, J.J., "Aztec surface–relief volume diffractive structure", Journal of the Optical Society of America, vol. 7, No. 8, pp. 1529–1544, Aug. 1990.
Ebbesen, T.W., et al., "Extraordinary optical transmission through sub–wavelength hole arrays", Nature, vol. 391, pp. 667–669, Feb. 1998.
Evans, A.F., et al., "Measurement of the electrically induced refractive idex change in silicon for wavelength =1.3 $\mu$m using a Schottky diode", Applied Physics Letters, vol. 56, No. 3, pp. 212–214, Jan. 1990.

(List continued on next page.)

*Primary Examiner*—Alan Diamond
(74) *Attorney, Agent, or Firm*—Scully, Scott, Murphy & Presser; Philip J. Feig, Esq.

(57) ABSTRACT

A surface-plasmon enhanced photovoltaic device including: a first metallic electrode having an array of apertures, an illuminated surface and an unilluminated surface, at least one of the surfaces having an enhancement characteristic resulting in a resonant interaction of incident light with surface plasmons; a second electrode spaced from the first metallic electrode; and a plurality of spheres corresponding to the array of apertures and disposed between the first metallic and second electrodes, each sphere having a first portion of either p or n-doped material and a second portion having the other of the p or n-doped material such that a p-n junction is formed at a junction between the first and second portions.

49 Claims, 3 Drawing Sheets

U.S. PATENT DOCUMENTS

| | | | |
|---|---|---|---|
| 5,250,812 A | 10/1993 | Murai et al. | |
| 5,306,902 A | 4/1994 | Goodman | |
| 5,351,127 A | 9/1994 | King et al. | |
| 5,354,985 A | 10/1994 | Quate | |
| 5,451,980 A | 9/1995 | Simon et al. | |
| 5,498,576 A * | 3/1996 | Hotchkiss et al. | 136/250 |
| 5,570,139 A | 10/1996 | Wang | |
| 5,633,972 A | 5/1997 | Walt et al. | |
| 5,663,798 A | 9/1997 | Karrai | |
| 5,686,919 A * | 11/1997 | Saito et al. | 136/259 |
| 5,789,742 A | 8/1998 | Wolff | |
| 5,846,843 A | 12/1998 | Simon | 436/527 |
| 5,933,233 A | 8/1999 | Gunther | |
| 5,973,316 A | 10/1999 | Ebbesen et al. | |
| 6,040,936 A | 3/2000 | Kim et al. | |
| 6,052,238 A | 4/2000 | Ebbesen et al. | |
| 6,127,624 A * | 10/2000 | Ishida et al. | 136/257 |

OTHER PUBLICATIONS

Haginoya, C., et al., "Nanostructure array fabrication with a size–controllable natural lithography", Applied Physics Letters, vol. 71, No. 20, pp. 2934–2936, Nov. 1997.

Lezec, H., "Light Squeeze", Science NOW, Feb. 11, 1998.

Ghaemi, H.F., et al., "Surface plasmons enhance optical transmission through subwavelength holes", Physical Review B, vol. 58, No. 11, pp. 6779–6782, Sep. 1998.

Raether, H., "Surface Plasmons on Smooth and Rough Surfaces and on Gratings", Springer–Verlag, pp. 109–116, 1998.

Sambles, R., "More than transparent", Nature, vol. 391, pp. 641–642, Feb. 1998.

Ordal, M.A., et al., "Optical properties of the metals Al, Co, Au, Fe, Pb, Ni, Pd, Pt, Ag, Ti, and W in the infrared and Far infrared", Applied Optics, vol. 22, No. 7, pp. 1099–1119, Apr. 1983.

Solgaard, O., et al., "High frequency attenuated total internal reflection light modulator", Applied Physics, vol. 61, No. 21, pp. 2500–2502, Nov. 1992.

Hand, A.J., "Photons Squeeze Through Tiny Holes", Photonics Spectra, pp. 36–37, May 1998.

Villeneuve, P.R., "Light beats that diffraction limit", Physics World, pp. 28–29, Apr. 1998.

Wang, Y., "Voltage–induced color–selective absorption with surface plasmons", Applied Physics Letters, vol. 67, No. 19, pp. 2759–2761, Nov. 1995.

Weber, W.H., et al., "Optical electric–field enhancement at a metal surface arising from surface–plasmon excitation", Optics Letters, vol. 6, No. 3, pp. 122–124, Mar. 1981.

Boardman, A.D., "Electromagnetic Surface Modes", Wiley–Interscience Publication, pp. 1–76, 661–724, 1982.

Wood, R.W., "Anomalous Diffraction Gratings", Physical Review, vol. 48, pp. 928–936, Dec. 1935.

Wood, R.W., "On a Remarkable Case of Uneven Distribution of Light in a Diffraction Grating Spectrum", Philosphical Magazine, vol. 4, pp. 396–403, Jun. 1902.

Yeatman, E.M., et al., "Spatial light modulation using surface plasmon resonance", Applied Physics Letters, vol. 55, No. 7, pp. 613–615, Aug. 1989.

"Flooding light through tiny holes", Science News, vol. 153, No. 9, Feb. 28, 1998.

"Startling Amount Of Light Gets Through Tiny Holes", John Wiley & Sons, 1998.

Botten, L.C., et al., "Inductive Grids In The Resonant Region: Theory And Experiment", International Jouranl of Infrared and Millimeter Waves, vol. 6, No. 7, pp. 511–575, 1985.

Ulrich, R., "Far–Infrared Properties Of Metallic Mesh And Its Complementary Structure", Infrared Physics, vol. 7, pp. 37–55, 1967.

John, S., "Localization Of Light", Physics Today, pp. 32–40, May 1991.

Yablonovitch, E., et al., "Hope for photonic bandgaps", Nature, vol. 351, p. 278, 1991.

Dalichaouch, R., et al., "Microwave localization by two–dimensional random scattering", Nature, vol. 354, pp. 53–55, 1991.

Joannopoulos, J.D., et al., Photonic Crystals, Princeton University Press, pp. 4–7, 1995.

Specht, M., et al., "Scanning Plasmon Near–Field Microscope", Physical Review Letters, vol. 68, No. 4, pp. 476–479, 1992.

Ulrich, R., "Interference Filters for the Far Infrared", Applied Optics, vol. 7, No. 10, pp. 1987–1996, 1968.

Sakai, K., et al., "Metallic Mesh Bandpass Filters and Fabry–Perot Interferometer for the Far Infrared", Japanese Journal of Applied Physics, vol. 8, No., 8, pp. 1046–1055, 1969.

Renk, K.F., et al., "Interference Filters and Fabry–Perot Interferometers for the Far Infrared", Applied Optics, vol. 1, No. 5, pp. 643–648, 1962.

Garg, R.K., et al., "Far–Infrared Characteristics Of Multi–Element Interference Filters Using Different Grids", Infrared Physics, vol. 18, pp. 292–298, 1978.

Chase, S.T., et al., "Resonant array bandpass filters for the far infrared", Applied Optics, vol. 22, No. 1, pp. 1775–1779, 1983.

Larsen T., "A Survey of the Theory of Wire Grids", IRE Transactions on Microwave Theory & Techniques, pp. 191–201. 1962.

Grupp, D.E., et al., "Beyond the Bethe Limit: Tunable Enhanced Light Transmission Through a Single–Wavelength Aperture", Advanced Materials, vol. 11, No. 10, pp. 860–862, 1999.

Schröter, U., et al., "Surface–plasmon–enhanced transmission through metallic gratings", Physical Review B, vol. 58, No. 3, Dec. 15, 1998, pp. 15419–15421.

Porto, J.A., et al., "Transmission Resonances on Metallic Gratings with Very Narrow Slits", Physical Review Letters, vol. 83, No. 14, pp. 2845–2848, 1999.

Grupp, D.E., et al., "Crucial Role of Metal Surface in enhance Transmission through Subwavelengh Apertures", NECI TR, Jun. 1, 2000.

Krishnan, A., et al., "Enhanced Light Transmission by Resonance Tunneling", NECI TR 99–152.

Nagayama, K., "Fabrication Of Two–Dimensional Colloidal Arrays", Phase Transitions, vol. 45, pp. 185–203, 1993.

Thio, T., et al., "Surface–plasmon–enhanced transmission through hole arrays in Cr films", Journal of Optical Society of America B, vol. 16, No. 10, Oct. 1999, pp. 1743–1748.

* cited by examiner

SURFACE-PLASMON ENHANCED PHOTOVOLTAIC DEVICE

BACKGROUND OF THE INVENTION

1. Field of the Invention

The present invention relates generally to photovoltaic devices and, more particularly, to flexible and stretchable photovoltaic devices with surface-plasmon enhanced conversion efficiency.

2. Prior Art

The most readily available source of renewable energy is the sun. Solar energy is harnessed and converted directly into electrical energy by the use of photovoltaic (PV) devices. At the heart of a PV device is a semiconductor p-n junction which forms a photo diode. When the p-n junction is illuminated with light of the appropriate wavelength, an electron-hole pair is generated; the electron and the hole are pulled in opposite directions by the internal electric fields of the p-n junction. The resulting photo current may be used to drive an electrical appliance downstream such as a pocket calculator or a battery charger.

Most commonly, PV modules are made on crystalline silicon wafers. It is straightforward to fabricate a planar p-n junction by growing various layers with the required dopants, and to pattern the front current collecting electrode, usually in a fingered geometry. While a planar geometry is useful for such flat-area applications as rooftop solar panels, in some cases it is preferable to have PV devices which are flexible, or which can be fabricated on a curved surface, for instance to act as a functional electricity generating "skin" on portable devices such as laptops or cellular phones, or even car roofs and hoods, without giving up design aesthetics.

One way to achieve some amount of flexibility is by using amorphous semiconductors, which can be evaporated onto a flexible plastic substrate, as is disclosed in U.S. Pat. Nos. 4,663,828 and 4,663,829, to R. A. Hartman and P. E. Koch, respectively. A flexible device proposed by Texas Instruments Inc., is known as a Spheral device and is disclosed in U.S. Pat. No. 4,614,835 to K. R. Carson et al. The total yield of these Spheral devices is claimed to be close to 10%, which if accurate is impressive for devices that are not made of single-crystal silicon.

Spheral devices have semiconductor spheres lodged in apertures in a perforated metal electrode and are sandwiched between the perforated metal electrode and a second electrode. The spheres are comprised of an n-doped semiconductor and a p-doped semiconductor with one contacting the perforated metal electrode and the other contacting the second electrode. While these devices have a degree of flexibility, they are not stretchable and do not have a degree of flexibility needed to conform to the shape of surfaces used in many electrical devices.

SUMMARY OF THE INVENTION

Therefore it is an object of the present invention to provide a surface-plasmon enhanced photovoltaic device with increased energy conversion efficiency over the spheral photovoltaic devices of the prior art.

It is a further object of the present invention to provide a surface-plasmon enhanced photovoltaic device with increased flexibility over currently available photovoltaic devices.

It is yet a further object of the present invention to provide a surface-plasmon enhanced photovoltaic device with increased stretchability over currently available photovoltaic devices.

It is yet a further object of the present invention to provide a surface-plasmon enhanced photovoltaic device meeting the above objectives yet not suffering in yield.

It is still yet a further object of the present invention to provide a surface-plasmon enhanced photovoltaic device meeting the above objectives which can be easily and economically fabricated.

A surface plasmon enhanced photovoltaic device and method for its fabrication are provided. The surface plasmon enhanced photovoltaic device boosts the performance of commercially available photovoltaic devices such as those based on Texas Instruments Spheral technology in which the current-generating p-n junction is between two layers or shells of a silicon sphere. Spheres are lodged in a large array in apertures of a metallic front electrode of which the surface topography is such that incident (sun)light interacts resonantly with surface plasmons on the metal surface. This leads to an enhancement of the oscillating electric fields, and therefore of the effective light intensity, at the spheres. Since the overall device can be designed to be mechanically flexible, it may be applied as a power-generating skin to a device to be powered.

The surface-plasmon enhanced photovoltaic device of the present invention comprises: a first metallic electrode having an array of apertures, the first metallic electrode having an illuminated surface upon which light is incident and an unilluminated surface, at least one of the illuminated and unilluminated surfaces having an enhancement characteristic resulting in a resonant interaction of the incident light with surface plasmons on the surface; a second electrode spaced from the first metallic electrode; and a plurality of spheres corresponding to the array of apertures and disposed between the first metallic and second electrodes, each sphere having a first portion of either p or n-doped material and a second portion having the other of the p or n-doped material such that a p-n junction is formed at a junction between the first and second portions, an individual sphere being disposed in the apertures such that one of the first or second portions is in electrical contact with the first metallic electrode and the other of the first or second portions is in electrical contact with the second electrode.

The enhancement characteristic preferably comprises a periodic surface topography, such as holes, dimples, or surface corrugations, on at least one of the illuminated and unilluminated surfaces of the first metallic electrode, the apertures in the metallic electrode being of a diameter comparable to or less than a wavelength of light incident thereon.

In a preferred implementation, the first portion is an outer portion or shell and the second portion is a center portion or core of the spheres where the shell is in electrical contact with the first metallic electrode and the core is in electrical contact with the second electrode.

Also provided is an electrical device comprising: at least one component requiring a power supply; and a power supply for powering the at least one component. The power supply comprises the surface-plasmon enhanced photovoltaic device of the present invention. In a preferred implementation, the surface-plasmon enhanced photovoltaic device further comprises an under layer fixed to the second electrode and a pressure sensitive adhesive backing on a free surface of the under layer for applying the surface-plasmon enhanced photovoltaic device to an exterior surface of the electrical device.

Still yet provided is a method for fabricating a photovoltaic device. Wherein the photovoltaic device comprises: a first metallic electrode having an array of apertures; a second electrode spaced from the first metallic electrode; and a plurality of PV spheres corresponding to the array of apertures and disposed between the first metallic and second electrodes, each PV sphere having a shell of either p or n-doped material and a core having the other of the p or n-doped material such that a p-n junction is formed at a junction between the shell and core, an individual sphere being disposed in the apertures such that the shell is in electrical contact with the first metallic electrode and the core is in electrical contact with the second electrode. The method comprises the steps of: providing the first metallic electrode having the array of apertures; providing an array of the PV spheres, each PV sphere corresponding to an aperture in the first metallic electrode; depositing a photo resist on the shells; developing the photo resist to expose a portion of the shells; etching the exposed portion of the shells to expose a corresponding portion of the core; and depositing the second electrode on the exposed core.

The providing of the first metallic electrode having an array of apertures preferably comprises the sub-steps of: providing a substrate; forming a periodic array of first polymer spheres on the substrate; etching the first polymer spheres to form an array of etched polymer spheres, the etched polymer spheres being smaller than the first polymer spheres and having the same lattice constant; depositing a conductive film on the substrate and array of etched polymer spheres; and removing the array of etched polymer spheres resulting in the first metallic electrode being carried on the substrate.

The PV spheres are preferably fixed to the first metallic electrode with an adhesive to fill any gaps between the spheres in which case any adhesive from what will become the exposed portion of the shells must be removed. Furthermore, the etching step of the PV spheres preferably results in an overhang of the photo resist such that depositing the second electrode allows electrical contact to the core of the PV sphere while preventing electrical contact of the shell with the second electrode.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF THE PREFERRED EMBODIMENT

Figure 1:
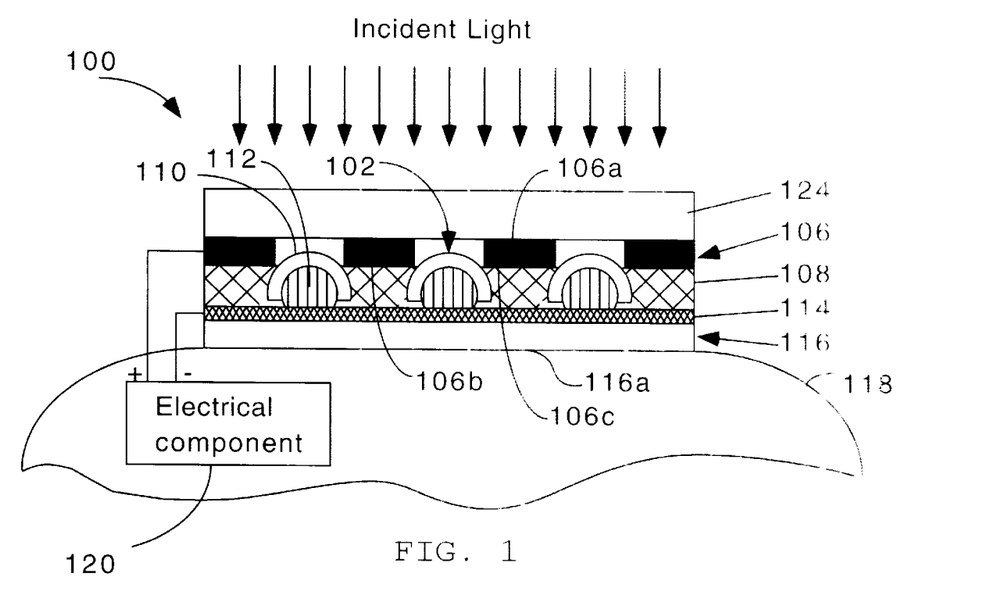
FIG. 1 illustrates a simplified sectional view of the surface-plasmon enhanced photovoltaic device of the present invention.
Figure 2:
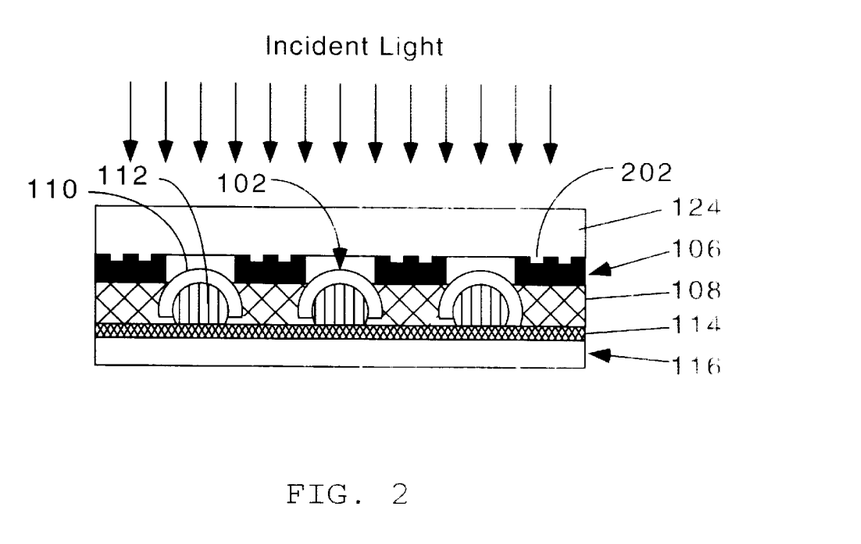
FIG. 2 illustrates a simplified sectional view of a variation of the surface-plasmon enhanced photovoltaic device of FIG. 1.

Referring now to FIGS. 1 and 2, there is shown a Spheral device functioning as a photovoltaic device, generally referred to by reference numeral 100. The illustrated photovoltaic device in FIGS. 1 and 2 are shown in a simplified schematical form for the purpose of explanation only, they do not represent the preferred configuration of the devices, which is more accurately shown in FIG. 4e. Referring back to FIGS. 1 and 2, the photovoltaic device 100 has a plurality of spheres 102, preferably Si, lodged into an array of apertures 104 in a first metallic electrode 106 (alternatively referred to herein as the first electrode), preferably a metal foil. The spheres are preferably held in place by an adhesive 108.

A first portion 110 of the spheres 102 is doped with a type of dopant (n or p) opposite to that of a second portion 112, so that a p-n junction is formed at the interface between the first and second portions 110, 112, respectively. Preferably, the first portion 110 is an outer shell or portion and the second portion is a center core or portion of the spheres 102. Thus, without limiting the present invention to a configuration where the spheres 102 comprise outer and center portions, the invention will be described in such environment. However, those of skill in the art will recognize that any number of configurations or materials can be utilized without departing from the scope or spirit of the invention. An alternative configuration may be where the PV sphere comprises two semi-spherical portions.

The outer portion 110 makes electrical contact with the first electrode 106 in which the spheres 102 are lodged. An opposite side of the spheres is processed to expose the center portion 112, so that the center portion 112 makes electrical contact with a second electrode 114. An insulating under layer 116 is preferably provided which serves to protect the second electrode 114 and may be provided with a pressure sensitive adhesive backing 116a. Light incident on the spheres 102 through the apertures 104 in the first electrode 106 generates a photo current which flows between the first and second electrodes 106 and 114, respectively.

The photovoltaic device 100 of the present invention is significantly improved over those known in the art in several ways. One such improvement is to use much smaller spheres 102, with diameters on the order of 1 $\mu$m. This allows the fabrication of photovoltaic devices with far greater mechanical flexibility than the Spheral devices of the prior art which have sphere diameters on the order of 1 mm, and makes possible a slight stretching of the substrate which may be useful in those cases in which the photovoltaic device needs to be molded around the contours of the hardware to be powered. For instance, a portable electrical device 118 which has at least one component 120 requiring electrical power.

More importantly, at small diameters the overall efficiency of the PV device can be improved significantly by the use of a surface plasmon enhanced device (PED) as the first electrode. The conversion efficiency of the Spheral device of the prior art is limited by the total area of the apertures 104 in the first electrode 106. The photovoltaic device 100 of the present invention boosts the total efficiency of the photovoltaic devices of the prior art significantly, without expanding the fractional area of the apertures 104 which would compromise the mechanical strength and the electrical reliability of the device, by using a resonance of the incident light with surface plasmons on either an illuminated surface 106a of the first electrode 106 upon which light is incident, or an unilluminated surface 106b, or both. The effect of the interaction with the surface plasmons is to concentrate the light at the apertures 104, which is where the photovoltaic spheres 102 are lodged, thus boosting the conversion efficiency per unit incident flux.

If an optically thick metal film is punched with a single aperture, of which the diameter is less than the wavelength of the incident light, the optical transmission is expected to be very small, and to be proportional to the fourth power of the ratio of the aperture diameter and the optical wavelength: $T \sim (d/\lambda)^4$. However, when the metal is perforated with an array of such subwavelength apertures, the optical transmission is enhanced by several orders of magnitude, and the total transmission can in fact exceed the fractional area occupied by the apertures.

For instance, in a silver film with an array of apertures of diameter 150 nm and lattice constant 900 nm, a large transmission peak is observed at ~1500 nm; the maximum transmission (~10%) exceeds unity when normalized to the fractional area of the apertures (~5%), corresponding to an enhancement of nearly three orders of magnitude compared to what would be expected for the same number of single apertures. [See T. W. Ebbesen et al., Nature 391, 667 (1998)].

The enhancement is a result of a resonant interaction of the incident light with surface plasmons (electronic excitations which are confined to the metal surface). The periodic structure of the aperture array allows grating coupling of the surface plasmons and the exciting light, through the grating momentum. The resulting band diagram can be probed by measuring the transmission as a function of incident angle; high transmission is obtained when both energy and momentum conservation are satisfied. The zero-order transmission spectra also show extinctions, or deep minima. These are due to Wood's anomaly, which occurs in diffraction gratings when a diffracted order becomes tangent to the plane of the grating. [See H. F. Ghaemi et al., Phys. Rev. B 58, 6779 (1998)].

The periodic structure on the first electrode 106 need not be an array of apertures 104, any surface topology will give rise to the transmission enhancement, such as a periodic array of indentations or dimples 202 on either the top surface (illuminated surface 106a) or bottom surface (unilluminated surface 106b) of electrode 106. In fact, the transmission through a single aperture is boosted significantly by the presence of a dimple array on either surface of the first electrode, compared to the transmission of an aperture in a smooth film. Furthermore, the wavelength at which the enhancement occurs can be tuned, since it is determined by the lattice constant of the dimple array [See D. E. Grupp et al., Adv. Mater. 11, 860 (1999)].

Additionally, it is not necessary to use a large array of surface features: a mini-array of 7 holes (a tiny part of a hexagonal array) is sufficient to get the full transmission enhancement of a large hexagonal array, albeit that the spectral features are broad. The total transmission of the light scales with the total aperture area and is independent of the wavelength, while a single aperture in a smooth metal film has a transmission which scales as $(d/\lambda)^4$. So the relative transmission enhancement is most pronounced for small apertures and long wavelength. [See T. Thio et al., JOSA B, 16, 1743 (1999)].

It has been shown that the total amount of light emerging from the apertures can be as large as twice the light directly incident on the apertures, even if the aperture is smaller than the wavelength of the light. Furthermore, calculations show that the oscillating electric field is enhanced in and near the apertures by factors >10 compared with the fields associated with the incident radiation, this corresponds to a boost in the intensity of more than two orders of magnitude, exactly at the places where the photocurrent generating spheres are located. Thus, the action of the surface plasmon enhanced device compensates for the loss of surface area due to the finite area occupied by the apertures in the perforated first electrode 106, and enhances significantly the overall conversion efficiency of the photovoltaic device 100. The first electrode 106 serves as an electrode with high parallelism so that the effect of defective photovoltaic spheres is minimized.

It is advantageous, though not necessary, to optimize the materials used and the geometry of the sphere array to match the solar spectrum which at the earth's surface peaks in the visible (at a wavelength close to $\lambda$=600 nm). The excitation spectrum of a typical semiconductor p-n junction shows a maximum, with the long-wavelength cutoff determined by the semiconductor bandgap and the short-wavelength cutoff given by the limited penetration depth due to absorption at the surface. The transmission spectrum of the first electrode 106 can be matched to the response spectrum of the photovoltaic device, since the transmission spectrum of the first electrode 106 has a set of peaks of which the center wavelength is determined by the lattice constant of the aperture array, and with a width determined by both the aperture size and the optical properties of the metal used for the first electrode 106.

Preferable materials for optimizing the performance of the spheres 102 are II–VI or III–V semiconductors, many of which have band gaps in the visible range, matching the broad maximum of the solar spectrum. However, silicon is also a viable material, indeed most of the solar cells in commercial production now use silicon.

Fabricating semiconductor spheres 102 at this length scale (on the order of 1 $\mu$m) is a challenge because the spheres 102 are too small to obtain by mechanical grinding methods and too large for assembly by chemical means. A first alternative is to start with a sphere, preferably metallic, which is slightly smaller than the desired size, and then coating it with two layers of semiconductor such that the semiconductors form a p-n junction at their interface. A preferable way to achieve this is by chemical deposition from a solution. A second alternative is to use larger semiconductor spheres, with diameter $\geq 5$ $\mu$m, also with a p-n junction, and optimizing the surface plasmon enhanced transmission by fabricating a surface pattern as discussed above, such as corrugations or dimples 202 with the appropriate periodicity, preferably close to P=600 nm.

The width of the transmission peaks depends on the optical properties of the first electrode 106, but only that portion of the first electrode 106 which is within a skin depth of the surface 106a, 106b. It is, after all, the surface plasmons which mediate the transmission enhancement. This has the advantage that the bulk, or core, of the first electrode 106 may be tailored for the desired mechanical and electrical conduction properties (e.g., high strength and ductility, high electrical conductivity), while the surface 106a, 106b may be selected independently for the properties required to match the photovoltaic semiconductors of the spheres 102 [See D. E. Grupp, H. J. Lezec, K. M. Pellerin, T. W. Ebbesen, Tineke Thio, "Fundamental Role of Metal Surface in Enhanced Transmission Through Subwavelength Apertures", to be puslihed in Appl. Phys. Lett., September 2000]. Preferably the surface layers 106a, 106b re made of silver, which in the visible region exhibits surface-plasmon enhanced transmission peaks with a narrow width and high transmission maxima, and thus high electric field enhancement near and in the apertures.

Furthermore, the total throughput can be increased significantly by matching the refractive indices of the dielectric media (124, 108), on the two sides (106a, 106b) of the perforated first electrode 106 in the presence of identical surface corrugation on both surfaces, as discussed more fully in co-pending U.S. application Ser. No. 09/435,132 filed Nov. 5, 1999, which is incorporated herein by its reference. The resulting coincidence of the surface plasmon dispersion relation on the two surfaces, leads to a resonant enhancement of the already large transmission. This process may be understood in terms of a resonant tunneling through the apertures 104 in the first electrode 106. For the rather complex structures of FIGS. 1 and 2, the resonance condition is met when the index of refraction of a first dielectric (alternatively referred to as over layer 124) is substantially equal to the effective refractive index of the composite medium consisting of the semiconductor spheres 102 and a second dielectric which is in direct contact with the first electrode 106. This second dielectric may be the adhesive 108 which fixes the spheres 102 in their position, or may be a thin dielectric layer 106c overcoating the bottom side of the perforated first electrode 106. In the latter case the thickness of the dielectric layer 106c must be at least as large as the skin depth of the surface plasmon mode, typically 100–200 nm.

For a large-area application of the present invention, because of its economy, self-assembly is the preferred method to create the array of apertures 104 in the first electrode 106, as well as to lodge the semiconductor spheres 102 in the apertures 104. Both can be done by using dispersions of spheres in a suitable liquid. Techniques for obtaining large areas of two-dimensional arrays of spheres are well known in the art. These techniques rely on a large effective attraction between the particles on the surface of the substrate, through surface tension of the liquid, and therefore always give rise to hexagonal close-packed structures, which have the additional advantage of large intensity enhancement compared to, other arrays such as a square array [Tineke Thio, H. F. Ghaemi, H. J. Lezec, P. A. Wolff, and T. W. Ebbesen, J. Opt. Soc. Am. B. 16, 1743 (1999)].

The outer portion 110 of the spheres 102 must be mechanically fixed to the first electrode 106 in such a way as to ensure ohmic contact with the first electrode 106. This may be done by the uniform deposition (e.g. by sputtering) of a suitable insulator 108 (which may also be an adhesive as discussed above) such as PMMA. Then a separate electrical contact must be made from the center portion 112 of the spheres 102 to the second electrode 114. In the large-diameter Spheral devices of the prior art this is done by mechanical polishing, but this is not practical in the case of micron-sized spheres. To achieve this connectivity it is preferred to use chemical etching, in combination with photolithographic methods for selective exposure of the sphere's center portion 112. Alternatively, the two materials comprising the p-n junctions can be chemically dissimilar so that the etching rates are sufficiently different to etch only the outer portion 110 but not the center portion 112. A combination of a III–V and a II–VI semiconductor is one possibility. A final metallization provides the second electrode 114. The second electrode 114 may be covered by the protective overlayer 116 of polymer or other insulator.

Figure 3A:
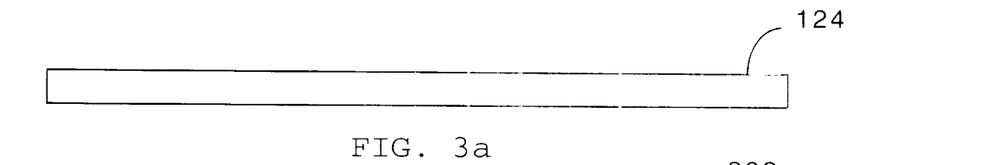
FIGS. 3a–3e illustrate the fabrication of the first electrode of the surface-plasmon enhanced photovoltaic device of FIG. 1 at different stages in the fabrication.
Figure 3B:
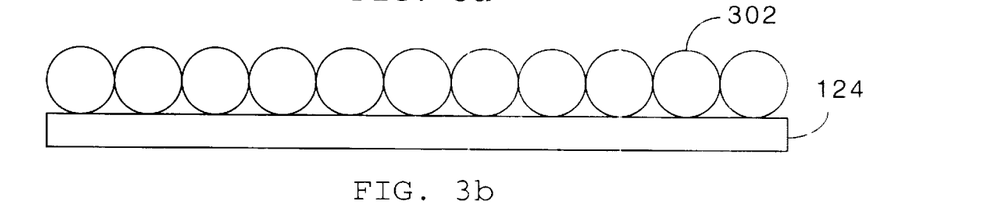

This process is illustrated in FIGS. 3a–3e and 4a–4e. FIGS. 3a–3e illustrate a preferred process for fabricating the perforated first electrode 106 [Haginoya, C.; Ishibashi, A. M.; Koike, K., Applied Physics Letters, 71, 2934–6, (1997)] while FIGS. 4a–4e illustrate a preferred process for fabricating the remaining components of the photovoltaic device 100 of the present invention. Referring now to FIG. 3a, a substrate 124 (which will become the over layer) is first provided, which may be flexible if desired. On top of this substrate 124 a two-dimensional array of polymer spheres 302 is formed by crystallization from an aqueous suspension, as shown in FIG. 3b. Such a crystallization method relies on the strong attraction between the spheres 302 due to surface tension effects, and results in a well-ordered hexagonal lattice of spheres 302, with a lattice constant equal to the diameter of the spheres 302. There will be occasional defects such as vacancies, and dislocations, which will alter locally the symmetry of the lattice. However, the transmission enhancement is sensitive to the local environment only within 2–3 lattice constants, so as long as such defects occur at a low enough density (their spacing is more than 5–10 lattice constants), they do not contribute significantly to the total optical transmission through the perforated first electrode 106. In this case the transmission enhancement close to the defects will simply be smaller than at the locations with perfect crystallinity, but will also not affect the overall device performance significantly.

Figure 3C:
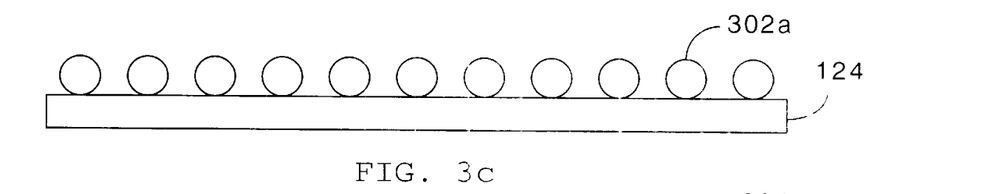
Figure 3D:
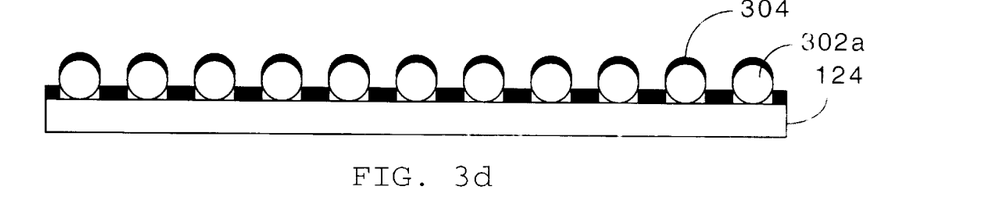
Figure 3E:
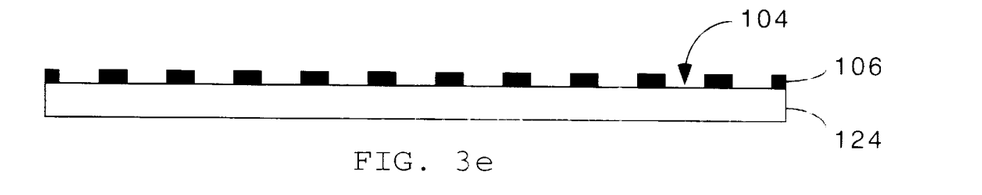

Referring now to FIG. 3c, the next step in the process involves dry etching of the polymer spheres 302, preferably by using a reactive ion etch with an oxygen plasma. This reduces the diameter of each sphere, without changing their locations, resulting in an ordered array of smaller spheres 302a with the same lattice constant as the original array. A metal film 304 is then deposited, preferably, by thermal or E-beam evaporation as is shown in FIG. 3d. After removal of the spheres 304, preferably by dissolving in acetone, the end result is a metal film perforated with apertures 104 located in a periodic hexagonal array as shown in FIG. 3e. The perforated metal film serves as the first electrode 106. The process shown in FIGS. 3a–3e is given by way of example only and not to limit the scope of the present invention. Those of skill in the art will understand that the perforated first electrode can be fabricated in any way known in the art without departing from the scope or spirit of the present invention, such as by using well-known holographic techniques.

Figure 4A:
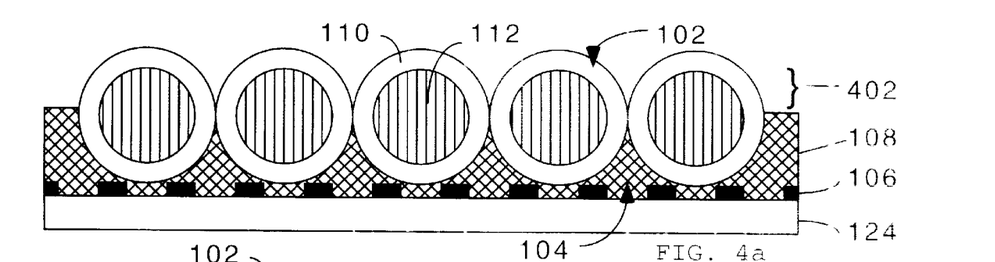
FIGS. 4a–4e illustrate the fabrication of the remaining components of the surface-plasmon enhanced photovoltaic device of FIG. 1 at different stages in the fabrication.

Referring now to FIGS. 4a–4e, the formation of the plurality of spheres 102 and their connectivity with the first and second electrodes 106, 114 are discussed. On top of the first electrode 106 is grown an array of the semiconductor spheres 102 with p-n junctions as shown in FIG. 4a. The diameter of these spheres may be equal to the lattice constant of the aperture array in the first electrode, 106, or may be an integer multiple thereof, in which case apertures will also lie in between spheres as shown in FIG. 4a. These spheres are crystallized by self-assembly using the same method as that outlined above, but the substrate now has indentations at the locations of the apertures 104, which fixes the position (the phase) of the semiconductor sphere array. For this reason the diameters of the semiconductor spheres 102 and that of the original polymer spheres 302 should be commensurate (that is, their ratio should be a rational number, and preferably an integer). The spheres 102 are fixed to the first electrode 106 with the adhesive 108 which is preferably clear and conducting, in order to allow the incident light to reach the spheres 102, to make good electrical contact to the first electrode 106, and to each other. Preferably the adhesive 108 is dissolved in the colloidal suspension for good penetration between the spheres 102 and the first electrode 106. Any adhesive 108 which is left on top of the spheres 102 is then removed, preferably by a dry etch to expose a portion 402 of the spheres 102.

Figure 4B:
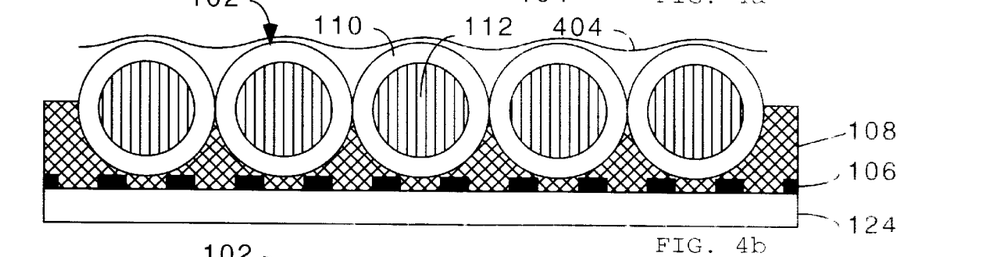
Figure 4C:
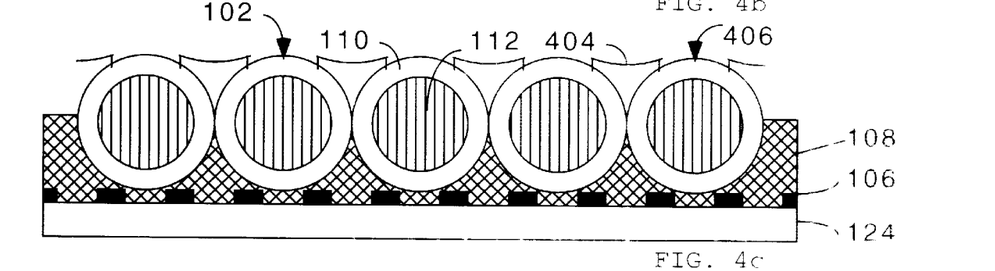

Referring now to FIG. 4b, a photo resist 404 having non-linear properties is then deposited onto the sphere 102 array. When exposed to ultra-violet light, the light is concentrated near the tops of the semiconductor spheres (because of their high refractive index), and developing the photo resist will result in apertures 406 in the photo resist 404 located near the tops of the spheres as shown in FIG. 4c. The diameter of these apertures 406 depends on the exact materials parameters of the photo resist 404 and the exposure parameters. Alternatively, an additional layer of Cr may be used (on top of the photo resist 404) to act as an etch mask for the next step, should the photo resist 404 by itself be insufficient to act as an effective mask.

Figure 4D:
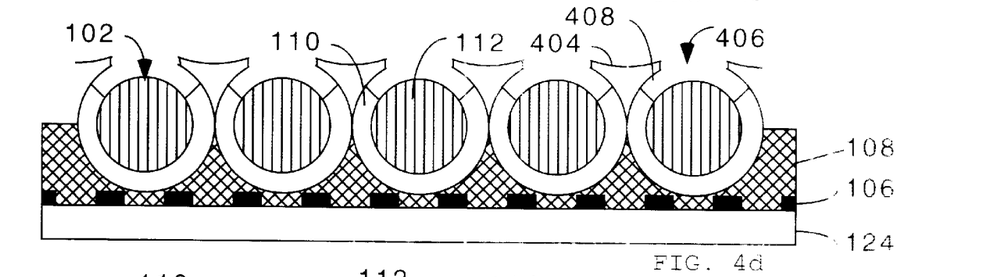
Figure 4E:
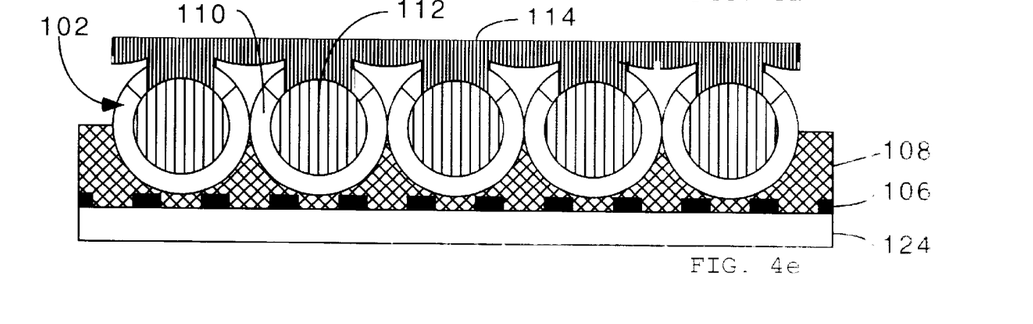

The next step, as illustrated in FIG. 4d, is an etch of the outer portion 110 of the spheres 102. The etch may be dry or wet and preferably results in an undercut 408, or an overhang of. the photo resist etch mask 404a. The purpose of the undercut 408 is to prevent electrical contact of the outer portion 110 with the second electrode 114, which is to be deposited by an angle-selective process such as E-beam or thermal evaporation as shown in FIG. 4e. Finally, a polymer layer 116 may be applied on top of the second electrode 114 which may include an adhesive layer 116a to fix the photovoltaic device to a rigid substrate (such as in the case of rooftop applications), or the electrical device 118 to be powered (such as in the case of a portable device).

If the dielectric layers (i.e., the over and under layers 124, 116, respectively) in the structure are made of flexible materials, such as plastics, or malleable materials, such as metals, the entire structure, of which the total thickness can be as small as 10 $\mu$m, can be made flexible and could even be designed such that it remains operational under some amount of stretch. The proper mechanical properties of the over layer 124 can also contribute greatly to the ruggedness of the device, so that it is practical to use it as a power generating skin which is not too delicate and can withstand a degree of abuse. Such an integration of the power generation onto the electrical device 118 to be powered would open the door to truly portable computing and telecommunication.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A surface-plasmon enhanced photovoltaic device comprising:

a first metallic electrode having an array of apertures, the first metallic electrode having an illuminated surface upon which light is incident and an unilluminated surface, at least one of the illuminated and unilluminated surfaces having an enhancement characteristic resulting in a resonant interaction of the incident light with surface plasmons on the surface;

a second electrode spaced from the first electrode; and a plurality of spheres corresponding to the array of apertures and disposed between the first metallic and second electrodes, each sphere having a first portion of either p or n-doped material and a second portion having the other of the p or n-doped material such that a p-n junction is formed at a junction between the first and second portions, an individual sphere being disposed in the apertures such that one of the first or second portions is in electrical contact with the first metallic electrode and the other of the first or second portions is in electrical contact with the second electrode.

2. The device of claim 1, wherein the enhancement characteristic comprises the apertures being of a diameter less than a wavelength of light incident thereon.

3. The device of claim 2, wherein the diameter is in a range of 1–5 $\mu$m.

4. The device of claim 3, wherein the diameter is about 1 $\mu$m.

5. The device of claim 1, wherein the enhancement characteristic comprises a pattern of periodic surface topography on at least one of the illuminated and unilluminated surfaces of the first electrode.

6. The device of claim 5, wherein the pattern of periodic surface topography comprises a periodic array of dimples surrounding each aperture of the array of apertures.

7. The device of claim 5, wherein the pattern of periodic surface topography comprises a periodic array of surface corrugations surrounding each aperture of the array of apertures.

8. The device of claim 1, wherein the first portion is one of a III–V or II–VI semiconductor and the second portion is the other of the III–V or II–VI semiconductor, with appropriate doping.

9. The device of claim 1, wherein the first portion is one of n-type or p-type silicon and the second portion is the other of the n-type or p-type silicon.

10. The device of claim 1, wherein the first portion is an outer portion and the second portion is a center portion of the spheres.

11. The device of claim 1, further comprising a substantially transparent overlayer on the illuminated surface of the first electrode.

12. The device of claim 1, further comprising a medium disposed between the first metallic and second electrodes and surrounding the array of spheres.

13. The device of claim 12, wherein the medium is an adhesive for also fixing the array of spheres to the first metallic electrode.

14. The device of claim 12, wherein the medium is conducting for providing electrical contact between the outer portion of the spheres and the first metallic electrode and between the spheres.

15. The device of claim 1, further comprising an under layer fixed to the second electrode.

16. The device of claim 15, wherein the under layer further has a pressure sensitive adhesive backing on a free surface for applying the device to another surface.

17. The device of claim 1, wherein both the illuminated and unilluminated surfaces comprise the enhancement characteristic.

18. An electrical device comprising:

at least one component requiring a power supply; and a power supply for powering the at least one component, the power supply comprising a surface-plasmon enhanced photovoltaic device, the surface-plasmon enhanced photovoltaic device comprising:

a first metallic electrode having an array of apertures, the first metallic electrode having an illuminated surface upon which light is incident and an unilluminated surface, at least one of the illuminated and unilluminated surfaces having an enhancement characteristic resulting in a resonant interaction of the incident light with surface plasmons on the surface;

a second electrode spaced from the first metallic electrode; and a plurality of spheres corresponding to the array of apertures and disposed between the first metallic and second electrodes, each sphere having a first portion of either p or n-doped material and a second portion having the other of the p or n-doped material such that a p-n junction is formed at a junction between the first and second portions, an individual sphere being disposed in the apertures such that one of the first or second portions is in electrical contact with the first metallic electrode and the other of the first or second portions is in electrical contact with the second electrode.

19. The device of claim 18, wherein the enhancement characteristic comprises the apertures being of a diameter less than a wavelength of light incident thereon.

20. The device of claim 19, wherein the diameter is in a range of 1–5 μm.

21. The device of claim 20, wherein the diameter is about 1 μm.

22. The device of claim 18, wherein the enhancement characteristic comprises a pattern of periodic surface topography on at least one of the illuminated and unilluminated surfaces of the first electrode.

23. The device of claim 22, wherein the pattern of periodic surface topography comprises a periodic array of dimples surrounding each aperture of the array of apertures.

24. The device of claim 22, wherein the pattern of periodic surface topography comprises a periodic array of surface corrugations surrounding each aperture of the array of apertures.

25. The device of claim 18, wherein the first portion is one of a III–V or II–VI semiconductor and the second portion is the other of the III–V or II–VI semiconductor, with appropriate doping.

26. The device of claim 18, wherein the first portion is one of n-type or p-type silicon and the second portion is the other of the n-type or p-type silicon.

27. The device of claim 18, wherein the first portion is an outer portion and the second portion is a center portion of the spheres.

28. The device of claim 18, further comprising a substantially transparent overlayer on the illuminated surface of the first metallic electrode.

29. The device of claim 18, further comprising a medium disposed between the first metallic and second electrodes and surrounding the array of spheres.

30. The device of claim 29, wherein the medium is an adhesive for also fixing the array of spheres to the first metallic electrode.

31. The device of claim 29, wherein the medium is conducting for providing electrical contact between the outer portion of the spheres and the first metallic electrode and between the spheres.

32. The device of claim 18, further comprising an under layer fixed to the second electrode.

33. The device of claim 32, wherein the under layer further has a pressure sensitive adhesive backing on a free surface for applying the device to an exterior surface of the electrical device.

34. The device of claim 18, wherein both the illuminated and unilluminated surfaces comprise the enhancement characteristic.

35. A method for fabricating a photovoltaic device, the photovoltaic device comprising: a first metallic electrode having an array of apertures; a second electrode spaced from the first metallic electrode; and a plurality of spheres corresponding to the array of apertures and disposed between the first metallic and second electrodes, each sphere having a shell of either p or n-doped material and a core having the other of the p or n-doped material such that a p-n junction is formed at a junction between the shell and core, an individual sphere being disposed in the apertures such that the shell is in electrical contact with the first metallic electrode and the core is in electrical contact with the second electrode, the method comprising the steps of:

providing the first metallic electrode having the array of apertures;

providing an array of the spheres, each sphere corresponding to an aperture in the first metallic electrode;

depositing a photo resist on the shells;

developing the photo resist to expose a portion of the shells;

etching the exposed portion of the shells to expose a corresponding portion of the core;

depositing the second electrode on the exposed core; and forming a surface plasmon enhancement characteristic on at least one of an illuminated and unilluminated surface of the first metallic electrode.

36. The method of claim 35, wherein the providing of the first metallic electrode having the array of apertures comprises the sub-steps of:

providing a substrate;

forming an array of first polymer spheres on the substrate;

etching the first polymer spheres to form an array of etched polymer spheres, the etched polymer spheres being smaller than the first polymer spheres and having the same lattice constant;

depositing a metallic film on the substrate and array of etched polymer spheres; and removing the array of etched spheres resulting in the first metallic electrode being carried on the substrate.

37. The method of claim 36, wherein the forming step comprises crystalizing the first array of spheres from an aqueous suspension.

38. The method of claim 36, wherein the etching of the first polymer spheres comprises a reactive ion etch with an oxygen plasma.

39. The method of claim 36, wherein the depositing of the metallic film comprises thermal evaporation.

40. The method of claim 36, wherein the depositing of the metallic film comprises E-beam evaporation.

41. The method of claim 36, wherein the removing step comprises dissolving the etched array of spheres in a solvent.

42. The method of claim 41, wherein the solvent is acetone.

43. The method of claim 35, further comprising the step of fixing the spheres to the first metallic electrode.

44. The method of claim 43, wherein the fixing step comprises providing an adhesive to fill any gaps between the spheres and wherein the method further comprises the step of removing any adhesive from what will become the exposed portion of the shells.

45. The method of claim 35, wherein the etching step results in an overhang of the photo resist relative to the core for preventing electrical contact of the shell with the second electrode.

46. The method of claim 35, wherein the depositing step comprises thermal evaporation.

47. The method of claim 35, wherein the depositing step comprises E-beam evaporation.

48. The method of claim 35, further comprising the step of forming a polymer layer on the second electrode.

49. he method of claim 48, further comprising the step of forming an adhesive backing on the polymer layer.

* * * * *